US007651585B2

(12) United States Patent
Yoon et al.

(10) Patent No.: US 7,651,585 B2
(45) Date of Patent: Jan. 26, 2010

(54) APPARATUS FOR THE REMOVAL OF AN EDGE POLYMER FROM A SUBSTRATE AND METHODS THEREFOR

(75) Inventors: Hyungsuk Alexander Yoon, Fremont, CA (US); Yunsang Kim, San Jose, CA (US); Jason A. Ryder, Oakland, CA (US); Andrew D. Bailey, III, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 325 days.

(21) Appl. No.: 11/236,170

(22) Filed: Sep. 26, 2005

(65) Prior Publication Data

US 2007/0068899 A1    Mar. 29, 2007

(51) Int. Cl.
*C23F 1/00* (2006.01)
*H01L 21/306* (2006.01)
*C23C 16/00* (2006.01)
(52) U.S. Cl. .............................. 156/345.43; 118/723 E
(58) Field of Classification Search ................. 118/722, 118/723 R, 723 E; 156/345.43
See application file for complete search history.

(56) References Cited

U.S. PATENT DOCUMENTS

| 4,425,210 | A | 1/1984 | Fazlin |
| 5,693,241 | A | 12/1997 | Banks et al. |
| 5,961,772 | A | 10/1999 | Selwyn |
| 6,189,570 | B1 | 2/2001 | Redemann et al. |
| 6,419,752 | B1 | 7/2002 | Shvets et al. |
| 6,534,921 | B1 | 3/2003 | Seo et al. |
| 6,936,546 | B2 * | 8/2005 | Robbins ..................... 438/707 |

| 2005/0178748 | A1 | 8/2005 | Buchberger et al. |

FOREIGN PATENT DOCUMENTS

WO    WO 2005045873 A2 *   5/2005

OTHER PUBLICATIONS

International (PCT) Search Report mailed Mar. 2, 2007 re PCT/US2006/036323.
Written Opinion mailed Mar. 2, 2007 re PCT/US2006/036323.
"International Preliminary Report on Patentability", Issue in PCT Application No.: PCT/US2006/036323; Mailing Date.: Apr. 3, 2008.
Yoon et al., "Atmospheric Plasma for Ru Surface Treatment Application", Apr. 18, 2005 (Lam Research Corporation) 5 pp.
Ryder et al., "Bevel Edge Polymer Removal with Tube Atmosphere Plasma", Apr. 15, 2005, (Lam Research Corporation) 18 pp.

(Continued)

*Primary Examiner*—Parviz Hassanzadeh
*Assistant Examiner*—Maureen Gramaglia
(74) *Attorney, Agent, or Firm*—IP Strategy Group, P.C.

(57)    ABSTRACT

An apparatus generating a plasma for removing an edge polymer from a substrate is disclosed. The embodiment includes a powered electrode assembly, including a powered electrode, a first dielectric layer, and a first wire mesh disposed between the powered electrode and the first dielectric layer. The embodiment also includes a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the edge polymer.

13 Claims, 9 Drawing Sheets

OTHER PUBLICATIONS

Kunze,"Miniaturized Discharges Prospects and Limits for Quantitative Analysis", (Dissertation) Jun. 25, 2004, 143 pp.

Selwyn et al.,"Materials Processing using an Atmospheric-Pressure Plasma Jet", (1999-2000) Physics Division Progress Report., pp. 189-197.

Babayan et al., "Deposition of Silicon Dioxide Films with a Non-Equilibrium Atmospheric-Pressure Plasma Jet", Sep. 12, 2001, Institute of Physics Publishing., pp. 573-578, stacks.iop.org/PSST/10/573.

Ichiki et al., "An Atmospheric-Pressure Microplasma Jet Source for the Optical Emission Specroscopic Analysis of Liquid Sample", Sep. 18, 2003, (Inst. of Phys. Pub., Plasma Srcs Sci Tech. 12), pp. 16-20, stacks.iop.org/PSST/12/S16.

Tepper et al., "Pulsed Uniform Barrier Discharges at Atmospheric Pressure", (Aug./Sep. 1998), Hakone VI Int'l Symp. On High Pressure, Low Temp Plasma Chem., Cork, Ireland, 5 pp.

Fong, "Electroless Cu Deposition Process on TIN for ULSI Interconnect Fabrication via PD/Sn Colloid Activation", Aug. 22, 2005, http://www.findarticles.com/p/articles/mi_qa3776/is_200301/ai_n9178017/print.

Davis, "How does a Faraday Cage Work? Or, Why can a Satellite Dish have Holes in it?", (2005) http://www.physlink.com/Education/AskExperts/ae176.cfm.

Kogelschatz, "Fundamentals and Applications of Dielectric-Barrier Discharges", (May 24, 2000), ABB Corp Research Ltd, Baden, Switzerland.

Kuthi, et al., "Modified Surface Removal with Atmospheric Plasma", Mar. 18, 2005, (Lam Research Corporation) 10 pp.

E. Aldea, C.P.G. Schrauwen, M.C.M. Van De Sanden: "Generation of a stable atmospheric glow in a DBD configuration" Proceedings of the 16TH International Symposium on Plasma Chemistry, Jun. 2003 (2003-06), XP009034055, Eindhoven Univ. Of Tech. Netherlands, 7pp.

* cited by examiner

APPARATUS FOR THE REMOVAL OF AN EDGE POLYMER FROM A SUBSTRATE AND METHODS THEREFOR

BACKGROUND OF THE INVENTION

The present invention relates in general to substrate manufacturing technologies and in particular to apparatus for the removal of an edge polymer from a substrate and methods therefor.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited. Control of the transistor gate critical dimension (CD) on the order of a few nanometers is a top priority, as each nanometer deviation from the target gate length may translate directly into the operational speed of these devices.

Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant gases are then flowed into the chamber and struck to form a plasma to etch exposed areas of the substrate.

During the etch process, it is not uncommon for polymer byproducts (edge polymers) to form on the top and bottom of a substrate bevel area. Bevel area refers to a surface area on the perimeter of the substrate where no dies are present. In general, polymers that form on the substrate bevel during the etch process are organic and may be composed of Carbon (C), Oxygen (O), Nitrogen (N), and/or Fluorine (F). However, as successive polymer layers are deposited on the bevel edge area as the result of several different etch processes, organic bonds that are normally strong and adhesive will eventually weaken and peel or flake off, often onto another substrate during transport. For example, substrates are commonly moved in sets between plasma processing systems via substantially clean containers, often called cassettes. As a higher positioned substrate is repositioned in the container, a portion of a polymer layer may fall on a lower substrate where dies are present, potentially affecting device yield.

A commonly known, relatively simple, and low-cost method of polymer removal may be the use of an atmospheric (or high pressure) plasmajet (APPJ), which generally allows a plasma to be focused on a particular location on the substrate, thus minimizing potential damage to dies on the substrate. An APPJ device generally mixes a large amount of an inert gas (e.g., He, etc.) with a small amount of a reactive gas (e.g., $CF_4$, $O_2$, etc.) in an annular volume (e.g., tube, cylinder, etc.) formed between an rf-powered electrode (along a longitudinal axis of the source) and a grounded electrode. The generated plasma may then be forced out one end of the annular volume (plasma effluent) by pressure caused by the influx of gases (gas influent). The shape and size of the plasma effluent may be controlled by adjusting the gas influent pressure, as well as the shape and size of the discharge orifice on the APPJ device.

In addition, an APPJ may also be combined with a reactive ion etch (RIE) in order to remove polymer byproducts. In general, RIE combines both chemical and ion processes in order to remove material from the substrate. Generally ions in the plasma enhance a chemical process by striking the surface of the substrate, and breaking the chemical bonds of the atoms on the surface in order to make them more susceptible to reacting with the molecules of the chemical process. Operating at ambient pressure conditions, atmospheric plasmas tend to relatively inexpensive in comparison to low-pressure plasmas that require sophisticated pumping systems to operate at near vacuum conditions. However, APPJ devices also tend to be susceptible to arcing.

An arc is generally a high power density short circuit which has the effect of a miniature explosion. When arcs occur on or near the surfaces of the target material or chamber fixtures, substantial damage can occur, such as local melting. Plasma arcs are generally caused by low plasma impedance which results in a steadily increasing current flow. If the resistance is low enough, the current will increase indefinitely (limited only by the power supply and impedance), creating a short circuit in which all energy transfer takes place. This may result in damage to the substrate as well as the plasma chamber. In order to inhibit arcing, relatively high plasma impedance generally must be maintained. A common solution may be to limit the rate of ionization in the plasma by using a large volume of inert gas at a relatively high flow rate. Another solution may be to position slots along the longitudinal axis of the powered electrode with the same electrical potential, in order to reduce the likelihood of arcing.

For example, in a common atmospheric plasma configuration, rf power creates an electrical discharge between a power electrode and a set of grounded electrodes that causes a process gas such as $O_2$ to ionize. However, as the density of electrically charged species (i.e., ions, etc.) in the plasma increases (typically above 2%), the likelihood of destructive arcing at the exposed electrode also increases. Hence, most atmospheric plasma processes typically also comprise mostly non-electrically charged (inert) gas, such as He, which limit ionization. In a polymer byproduct removal application, however, the large volume (high flow) of inert gas may make the use of atmospheric plasma economically impractical. For example, the substantial removal of a polymer from just a 5 $mm^2$ surface area on the substrate may require over 10 slm (standard liters per minute) of an inert gas. This corresponds to the consumption of over 100 liters of the inert gas for a single typical 300 mm substrate. Aside from the cost of obtaining semi-conductor grade inert gas, storing such a large volume of gas in a manufacturing facility may be unworkable. Additionally, because the required inert gas processing equipment may be costly, cleaning and recycling the inert gas may be economically impractical.

Figure 1:
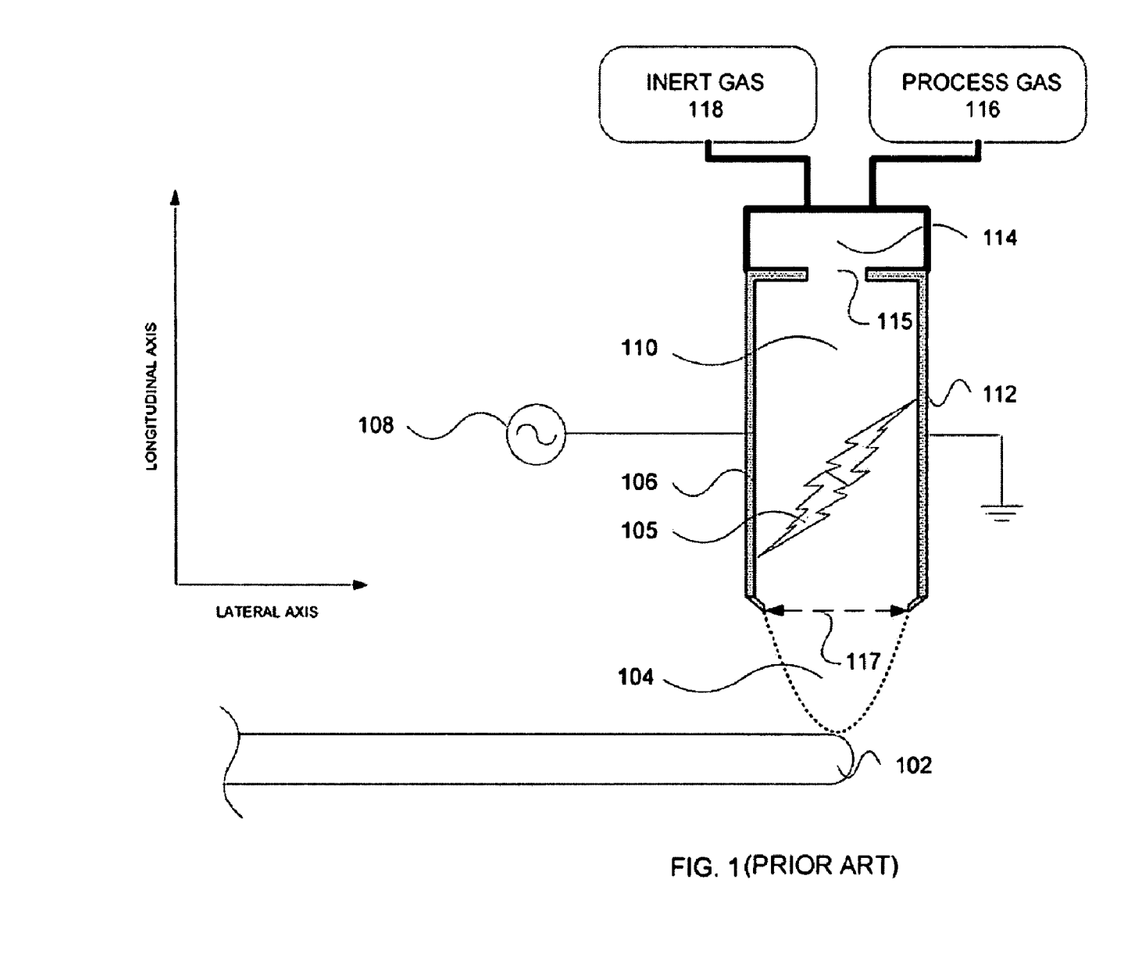
FIG. 1 shows a simplified diagram of an atmospheric plasma jet device, in which both the powered electrode and the ground electrode are each configured on a cavity wall.

Referring now to FIG. 1, a simplified diagram of an atmospheric plasma jet device, in which both the powered electrode and the ground electrode are each configured on a cavity wall, is shown. Generally, an inert gas 118 (e.g., He, etc.) and a process gas 116 (e.g., $CF_4$, etc.) are flowed into sealed box 114 for pressurizing. The gases are, in turn, feed into a discharge chamber cavity 110 through gas influent 115, at which point a plasma is struck with an RF power source 108 and creates plasma effluent 104 from discharge orifice 117 at one end of cavity 110 to clean substrate 102. In general, the shape and diameter of discharge orifice 117 may affect the corresponding shape of plasma effluent 104 along both the lateral and longitudinal axis (e.g., laterally narrow and longitudinally deep, laterally wide and longitudinally shallow, etc.). However, as previously stated, a large volume of inert gas may be required to prevent the generation of arc 105 between powered electrode 106 to grounded electrode 112.

Figure 2:
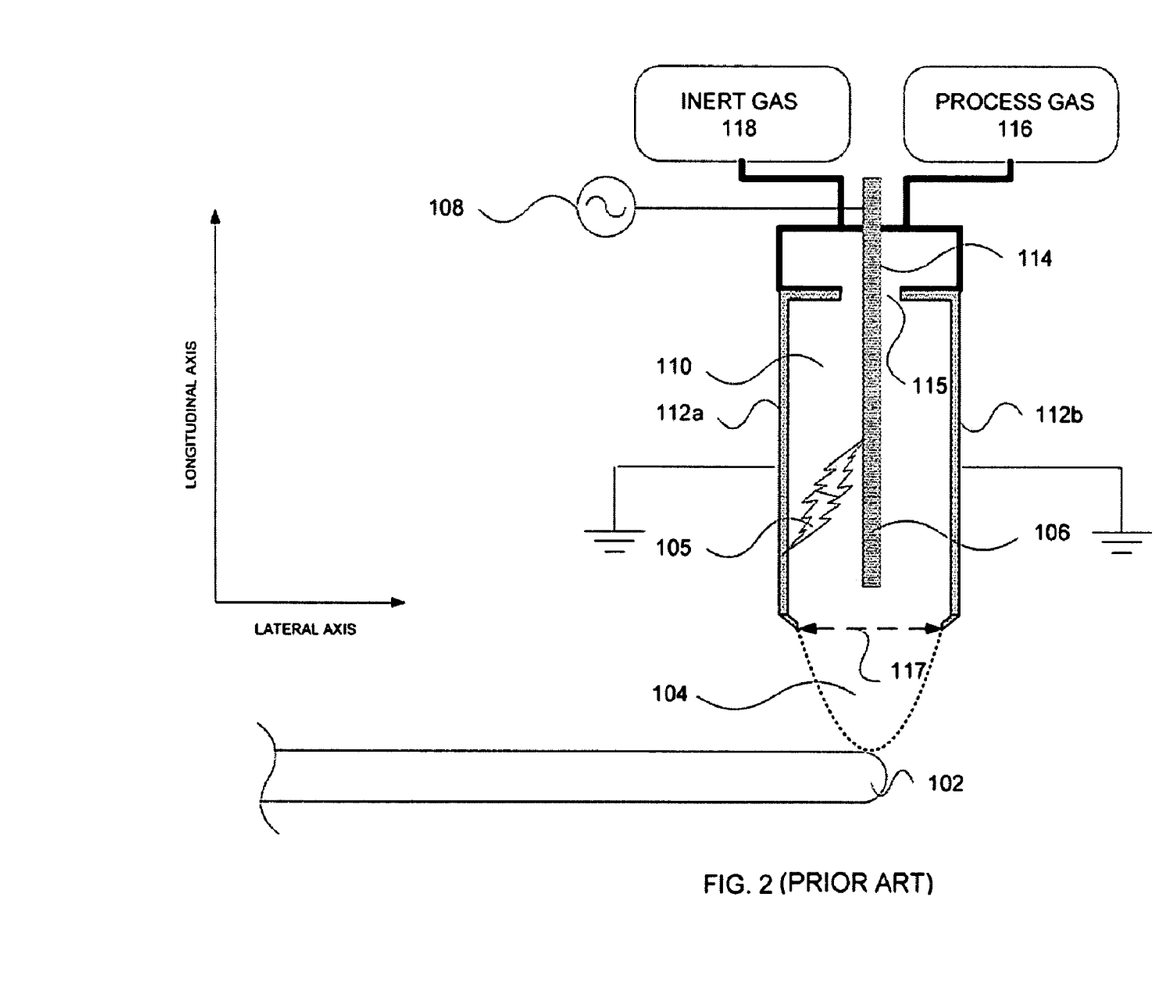
FIG. 2 shows a simplified diagram of an atmospheric plasma jet device, in which a powered electrode is configured as a center rod and a ground electrode(s) is configured on a cavity wall.

Referring now to FIG. 2, a simplified diagram of an atmospheric plasma jet device, in which a powered electrode is configured as a center rod and a grounded electrode(s) is configured on a cavity inner surface, is shown. As before, generally, an inert gas 118 (e.g., He, etc.) and a process gas 116 (e.g., $CF_4$, etc.) are flowed into sealed box 114 for pressurizing. The gases are, in turn, feed into a discharge chamber cavity 110 through gas influent 115, at which point plasma 104 is struck with an RF power source 108 and creates plasma effluent 104 from discharge orifice 117 at one end of cavity 110 to clean substrate 102. In general, the shape and diameter of discharge orifice 117 may affect the corresponding shape of plasma effluent 104 along both the lateral and longitudinal axis (e.g., laterally narrow and longitudinally deep, laterally wide and longitudinally shallow, etc.). However, as previously stated, a large volume of inert gas may be required to prevent the generation of arc 105 between powered electrode 106 to grounded electrode 112.

Figure 3:
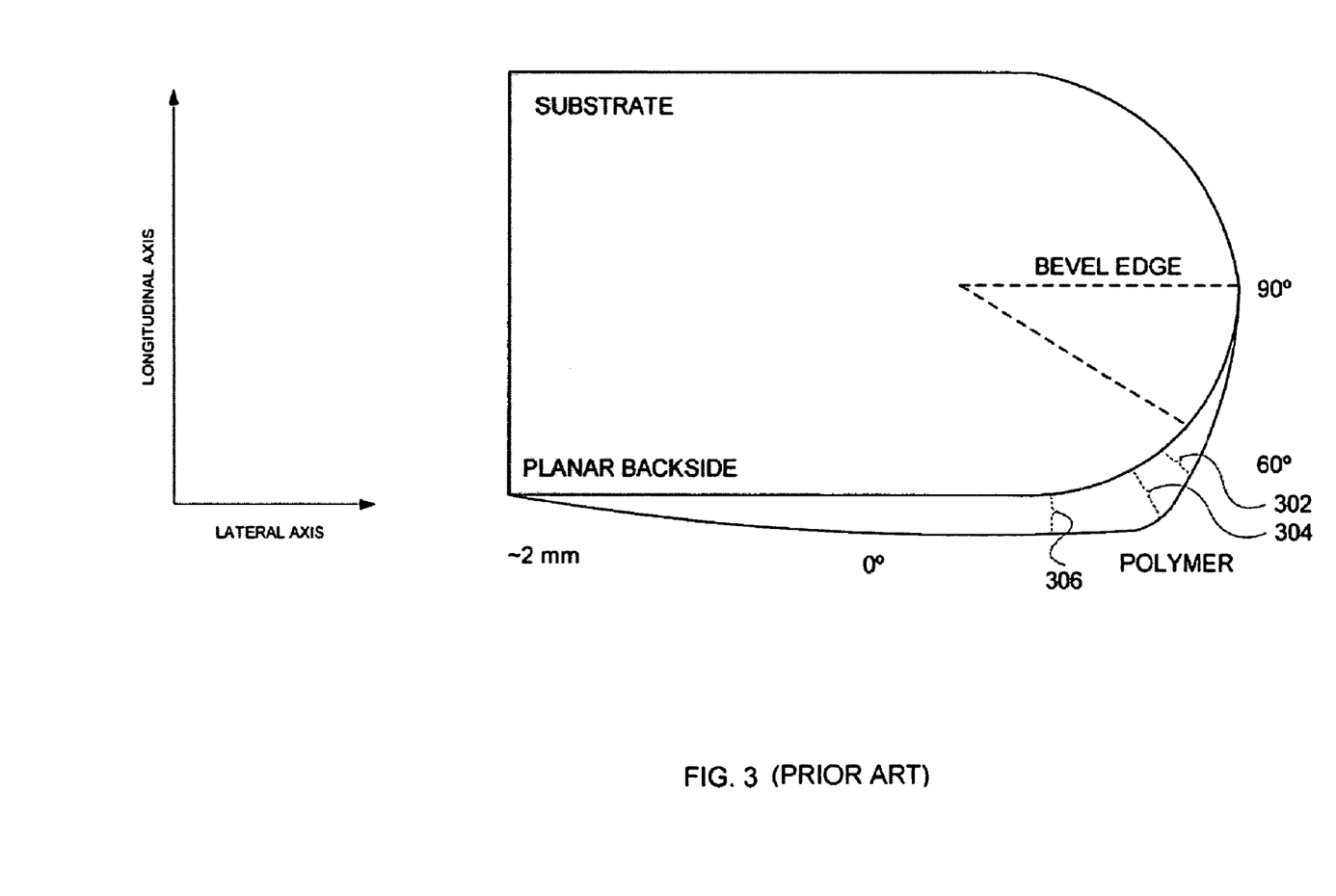
FIG. 3 shows a simplified diagram of a substrate in which a set of edge polymers have been deposited on the planar backside.

Referring now to FIG. 3, a simplified diagram of a substrate in which a set of edge polymers have been deposited on the planar backside is shown. As previously stated, during the etch process, it is not uncommon for polymer byproducts (edge polymers) to form on the substrate. In this example, the polymer byproducts have been deposited on the planar backside, that is, the side of the substrate away from the plasma. For example, the polymer thickness may be about 250 nm at about 70° 302, 270 nm at about 45° 304, and about 120 nm at 0° 306. In general, the greater the thickness of the polymer, the higher the likeliness that a portion of the polymer may become dislodged and fall onto another substrate, potentially affecting manufacturing yield.

In view of the foregoing, there are desired apparatus for the removal of an edge polymer from a substrate and methods therefore.

SUMMARY OF THE INVENTION

The invention relates, in an embodiment, to an apparatus generating a plasma for removing an edge polymer from a substrate. The embodiment includes a powered electrode assembly, including a powered electrode, a first dielectric layer, and a first wire mesh disposed between the powered electrode and the first dielectric layer. The embodiment also includes a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the edge polymer.

The invention relates, in an embodiment, to a method for generating a plasma for removing an edge polymer from a substrate. The method includes providing a powered electrode assembly, the powered electrode assembly including a powered electrode, a first dielectric layer, and a first wire mesh disposed between the powered electrode and the first dielectric layer. The method also includes providing a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the an edge polymer. The method further includes introducing at least one inert gas and at least one process gas into the cavity, and applying an rf field to the cavity using the powered electrode to generate the plasma from the at least one inert gas and the at least one process gas.

The invention relates, in an embodiment, to a method for generating a plasma for removing an edge polymer from a substrate. The method includes providing a powered electrode assembly, the powered electrode assembly including a powered electrode, a first dielectric layer, and a first wire mesh disposed between the powered electrode and the first dielectric layer. The method further includes providing a grounded electrode assembly disposed opposite the powered electrode assembly so as to form a cavity wherein the plasma is generated, the first wire mesh being shielded from the plasma by the first dielectric layer when the plasma is present in the cavity, the cavity having an outlet at one end for providing the plasma to remove the an edge polymer. The method also includes applying an rf field to the cavity using the powered electrode to generate the plasma from at least one inert gas and the at least one process gas.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, the inventor believes that an atmospheric pressure plasma jet device, in which a dielectric barrier and a wire mesh are positioned between at least one electrode and a plasma (DWM-APPJ), may minimize arcing at a relatively low (less than about 1 slm) inert gas flow rate, and hence may effectively remove an edge polymer from a substrate.

In general, arcing occurs when an over voltage is applied to the discharge gap between electrodes, such that electron avalanches reach a critical stage where extremely fast streamer propagation becomes possible. As a result, micro discharge channels are formed. However, since the dielectric barrier also tends to act as an electret (generally a material that accumulates electrical charges on its surface), the micro discharge channels spread across the dielectric barrier into surface discharges covering a much larger region than the original channel diameter. Due to charge build-up on the dielectric surface, the field at the location of a micro discharge collapses within a few nanoseconds after breakdown, thus terminating the current flow at this location. However, often this breakdown may also result in collapse of the plasma itself. In an advantageous way, the wire mesh prevents this collapse.

In general, electromagnetic waves, such as produced by an rf generator, do not penetrate through holes in a conducting surface like a wire mesh that are less than about a wavelength across. The generated rf field may be attenuated in different amounts and to different degrees by altering diameter of the wire mesh holes. It is believed that the creation of a secondary electric field on the surface of the dielectric barrier by the wire mesh with properly sized holes helps to sustain a plasma without arcing at a substantially smaller inert gas flow rate. Thus, the addition of at least one wire mesh between an electrode and a dielectric barrier in a DWM-APPJ allows a plasma jet to be generated that may substantially remove polymer byproducts at a particular substrate location, at relatively small inert gas flow rates (less than about 1 slm). In addition, unlike previous APPJ configurations, DWM-APPJ does not require slots along the longitudinal axis of the powered electrode. Slots generally increase the size, complexity, and cost of an APPJ.

Generally, the tolerance of one wavelength of the rf is taken to be the approximate cross over point between satisfactory and unsatisfactory performance. However, in general, holes or surface variations in the wire mesh must usually be less than a fraction of a wavelength across in order not to impose unacceptable performance degradation. In addition, the wire mesh is generally not grounded in order to allow penetration of the rf field into the plasma.

In an embodiment, a dielectric barrier is positioned between a single electrode and a plasma. In an embodiment, a dielectric barrier is positioned between all the electrodes and a plasma. In an embodiment, a dielectric barrier is positioned between a powered electrode and a plasma. In an embodiment, a dielectric barrier is positioned between a grounded electrode and a plasma. In an embodiment, a wire mesh is placed between the dielectric barrier and an electrode. In an embodiment, a wire mesh is placed between each dielectric barrier and electrode. In an embodiment, a wire mesh is placed between a dielectric barrier and a powered electrode. In an embodiment, a wire mesh is placed between a dielectric barrier and a grounded electrode.

In an embodiment, the wire mesh comprises Copper (Cu). In an embodiment, the wire mesh comprises stainless steel. In an embodiment, the wire mesh comprises brass. In an embodiment, the wire mesh is galvanized. In an embodiment, the wire mesh is monofilament. In an embodiment, the wire mesh has a rectangular weave. In an embodiment, the wire mesh has a hexagon weave. In an embodiment, the dielectric comprises biaxially-oriented polyethylene terephthalate (bo-PET) polyester, such as MYLAR® available from DuPont Teijin Films (www.dupontteijinfilms.com). In an embodiment, the dielectric comprises a ceramic. In an embodiment, the dielectric comprises formed of a material comprising polytetrafluoroethylene (PTFE), such as TEFLON® available from DuPont (www.dupont.com).

Figure 4:
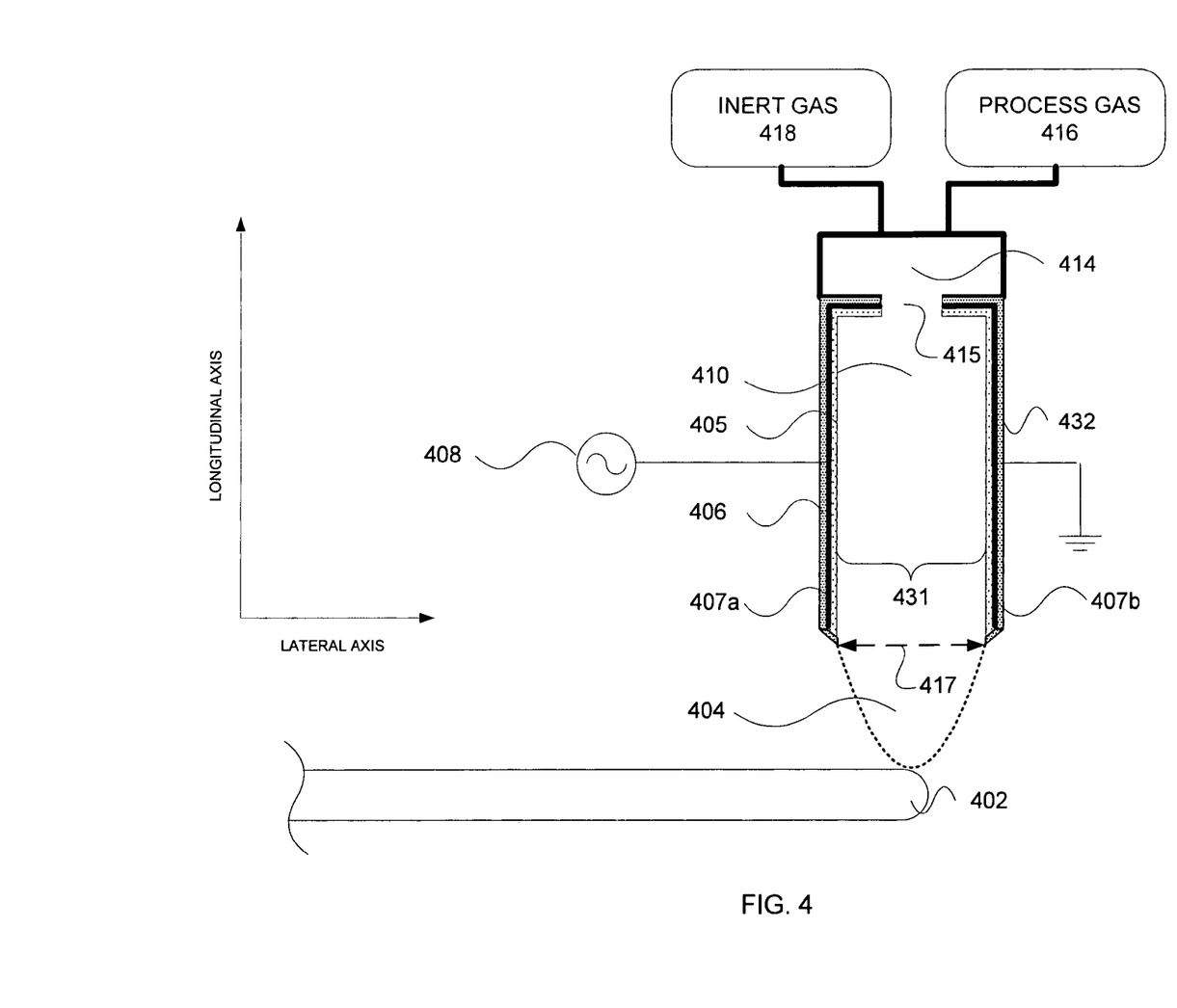
FIG. 4 shows a simplified diagram of a DWM-APPJ device, which both the powered electrode and the ground electrode are each configured on a cavity wall, according to an embodiment of the invention.

Referring now to FIG. 4, a simplified diagram of a DWM-APPJ device is shown, which both the powered electrode and the ground electrode are each configured on a cavity wall, according to an embodiment of the invention. In addition, unlike commonly used configurations, wire mesh 407a positioned between powered electrode 406 and dielectric barrier 405, and wire mesh 407b positioned between grounded electrode 432 and dielectric barrier 405, may allow a plasma to be sustained without arcing at a substantially smaller inert gas flow rate (less than about 1 slm) than is commonly required (e.g., about 10 slm, etc.). Generally, an inert gas 418 and a process gas 416 are flowed into sealed box 414 for pressurizing. The gases are, in turn, feed into a discharge chamber cavity 410 through gas influent 415, at which point plasma is struck with an RF power source 408 and creates plasma effluent 404 from discharge orifice 417 at one end of cavity 410, in order to clean substrate 402. In addition, although each electrode is configured with a wire mesh in this embodiment, other embodiments may comprise only a single wire mesh on either powered electrode 406 or grounded electrode 432. In embodiment, diameter 431 is about between 0.5 mm and about 6 mm. Advantages of this embodiment include the ability to generate a plasma jet that substantially removes edge polymer byproducts with a relatively small inert gas flow rate (less than about 1 slm), avoiding the cost of obtaining a large volume of a semi-conductor grade inert gas, or in purchasing expensive inert gas recycling equipment.

Figure 5:
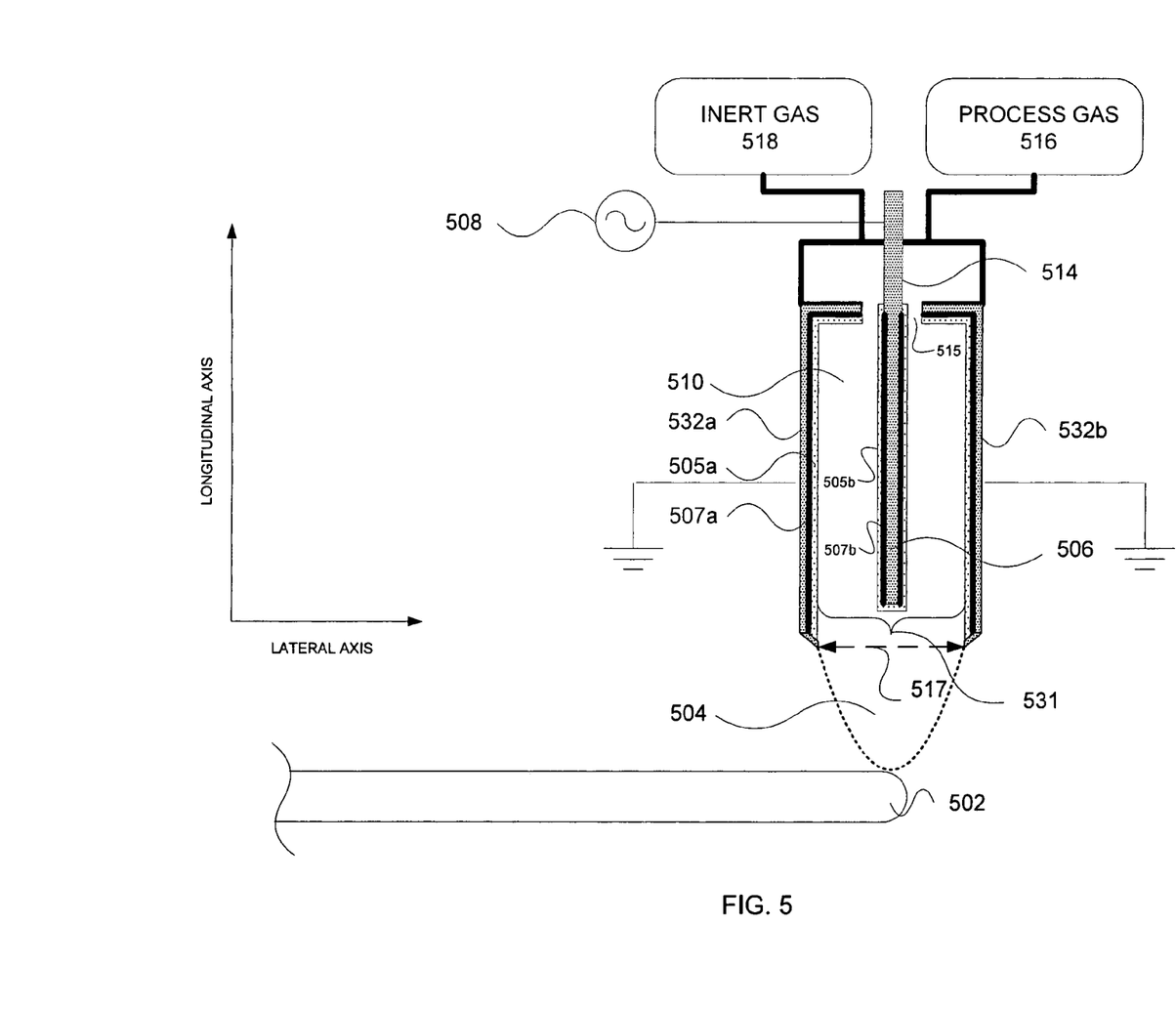
FIG. 5 shows a simplified diagram of a DWM-APPJ device in which a powered electrode is configured as a center rod and a ground electrode(s) is configured on a cavity inner surface, according to an embodiment of the invention.

Referring now to FIG. 5, a simplified diagram of a DWM-APPJ device is shown, in which a powered electrode is configured as a center rod and a ground electrode(s) is configured on a cavity inner surface, according to an embodiment of the invention. In addition, unlike the prior art, a wire mesh 507b positioned between powered electrode 506b and dielectric barrier 505b, and wire mesh 507a is positioned between grounded electrode 532a-b and dielectric barrier 505a, may allow a plasma to be sustained without arcing at a substantially smaller inert gas flow rate (less than about 1 slm) than is commonly required (e.g., about 10 slm, etc.). As before, generally, an inert gas 518 and a process gas 516 are flowed into sealed box 514 for pressurizing. The gases are, in turn, feed into a discharge chamber cavity 510 through gas influent 515, at which point a plasma is struck with an rf power source 508 and creates plasma effluent 504 from discharge orifice 517 at one end of cavity 510 to etch or clean substrate 502. In embodiment, diameter 531 is about between 0.5 mm and about 6 mm. Advantages of this embodiment include the ability to generate a plasma jet that substantially removes edge polymer byproducts with a relatively small inert gas flow rate (less than about 1 slm), avoiding the cost of obtaining a large volume of a semi-conductor grade inert gas, or in purchasing expensive inert gas recycling equipment.

For example, using a DWM-APPJ device in order to remove bevel edge polymer, at a power setting of 1-20 W RF power, and a frequency of about 2 MHz to about 13.56 MHz, less than 1 slm of He flow may be required to prevent arcing with about 100 sccm to about 500 sccm of $O_2$ flow. This is substantially less than about 10 slm of He normally required for a comparable operation with a commonly used APPJ device.

Figure 6:
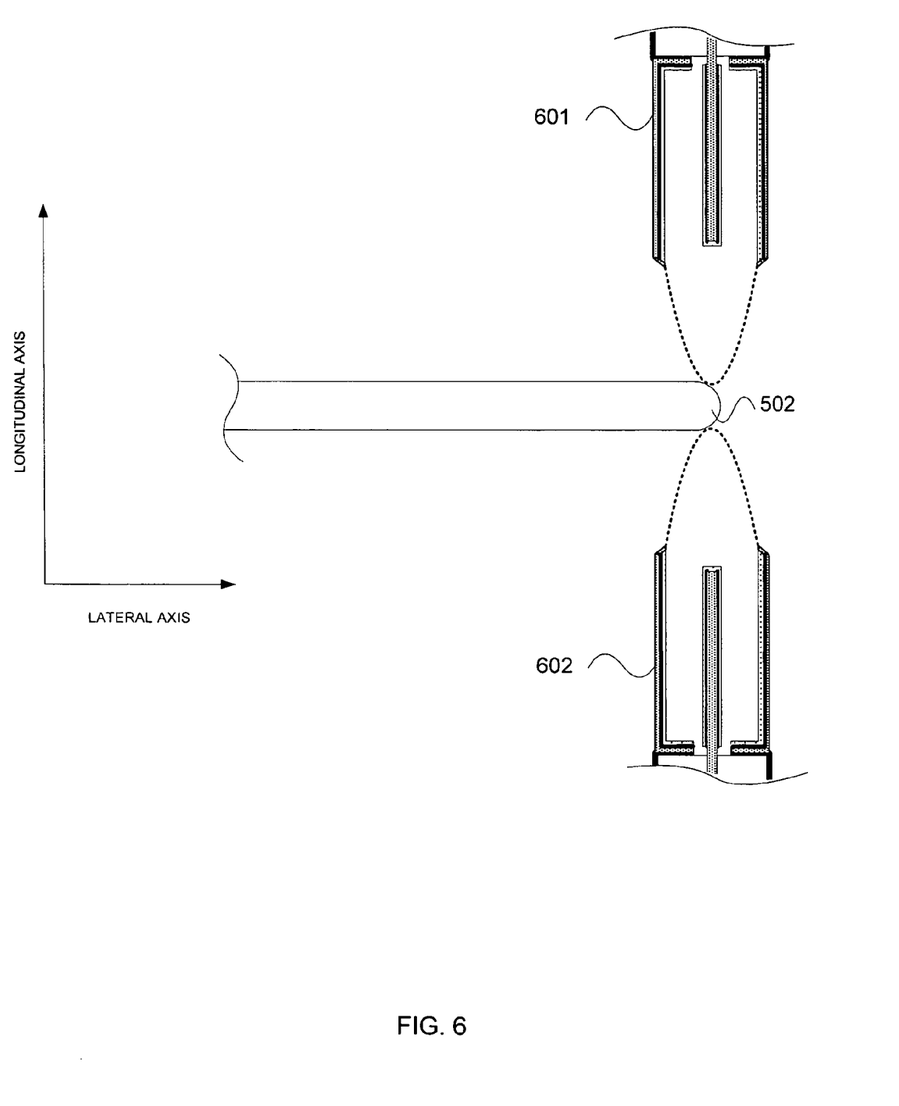
FIG. 6 shows a simplified diagram of a set of DWM-APPJ devices, as described in FIG. 5, according to an embodiment of the invention.

Referring now to FIG. 6, a simplified diagram of a set of DWM-APPJ devices, as described in FIG. 5, is shown according to an embodiment of the invention. In this embodiment, each DWM-APPJ device is posited on the longitudinal axis, with DWM-APPJ 601 positioned to remove polymer byproducts from surface of the substrate that faces a plasma, also known as the planar front side, and DWM-APPJ 602 positioned to remove polymer byproducts from surface of the substrate that faces the chuck, also known as the planar back side. By simultaneously removing edge polymers, the substrate processing time is reduced by about 50%, increasing manufacturing throughput.

Figure 7:
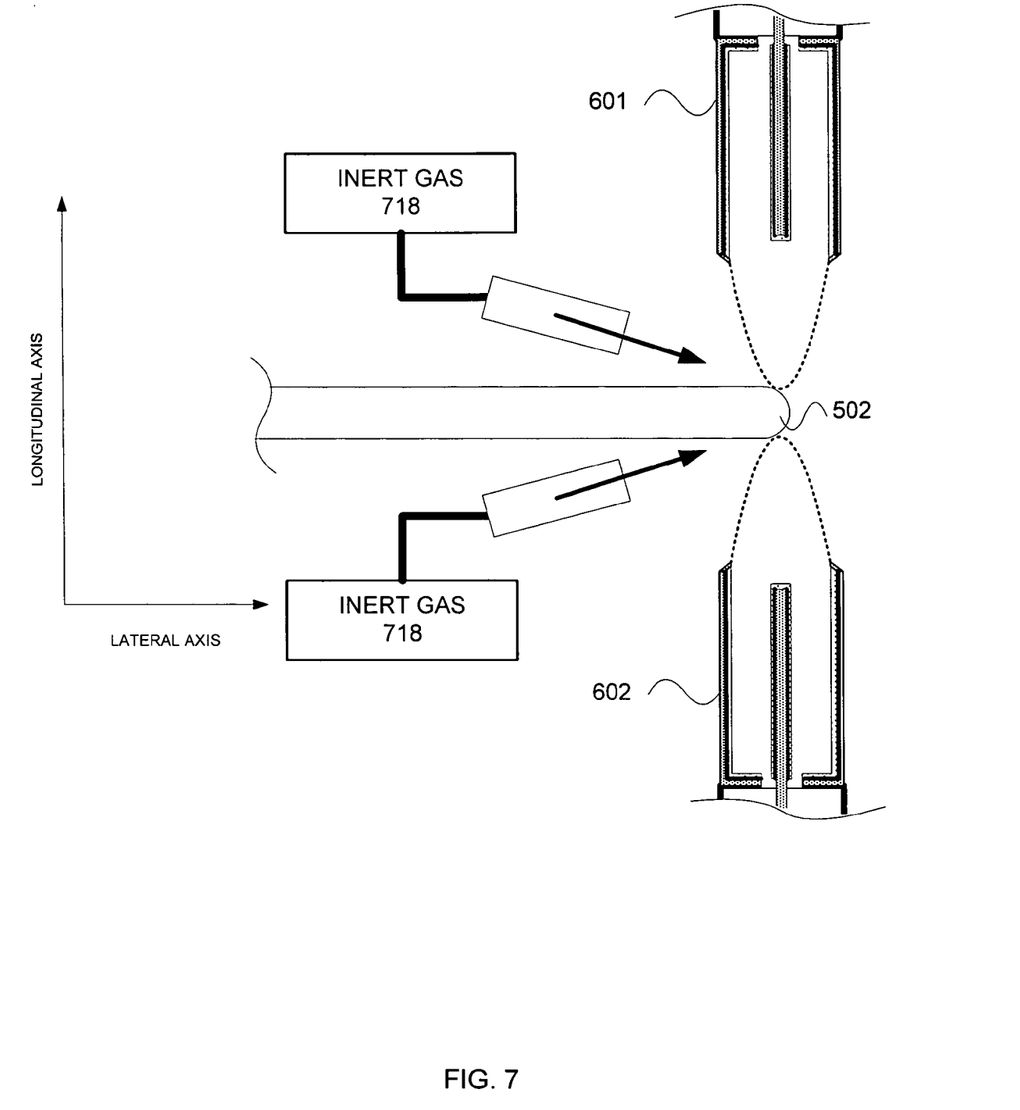
FIG. 7 shows a simplified diagram of a set of DWM-APPJ devices, as described in FIG. 6, with an additional set of inert gas jets, according to an embodiment of the invention.

Referring now to FIG. 7, a simplified diagram of a set of DWM-APPJ devices, as described in FIG. 6, is shown with an additional set of inert gas jets, according to an embodiment of the invention. In this configuration, the set of inert gas jets 718 may be posited to push any volatile byproducts produced by DWM-APPJ devices 601 and 602 away from substrate 502, in order to substantially reduce any further contamination of the substrate surface.

Figure 8:
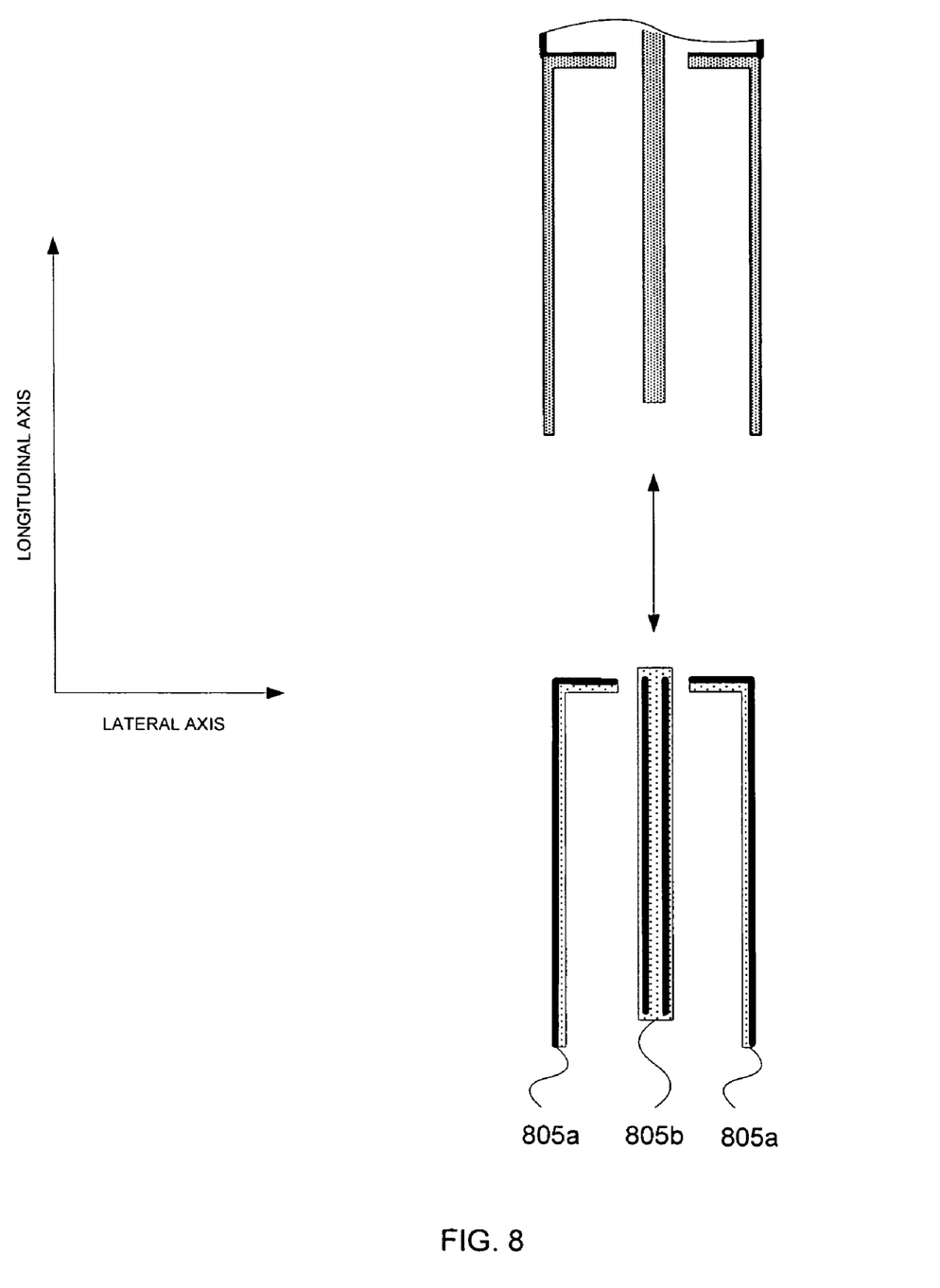
FIG. 8 shows a simplified diagram of a DWM-APPJ device, in which a set of wire mesh-dielectric sleeves is changeable, according to an embodiment of the invention.

Referring now to FIG. 8, a simplified diagram of a DWM-APPJ device, in which a set of wire mesh-dielectric sleeves is changeable, is shown, according to an embodiment of the invention. As previously described, an rf field may be attenuated in different amounts and to different degrees by altering diameter of the wire mesh holes. Hence, allowing various wire mesh-dielectric sleeves 805a and 805b, each with different wire mesh hole diameter, may allow the DWM-APPJ device to be optimized for a particular configuration or recipe. That is, each wire mesh-dielectric sleeve 805a and 805b is positioned in the DWM-APPJ between the appropriate electrode and a plasma in order to minimize arcing. In an embodiment, 805a and 805b have the same hole diameter, for any given configuration. In an embodiment, 805a and 805b have different hole diameters for any given configuration.

In an embodiment, a wire mesh layer is sandwiched between two dielectric layers. In an embodiment, a wire mesh layer is bonded to a dielectric layer with an adhesive, such as a silicon adhesive. In an embodiment, a wire mesh layer is secured to a dielectric layer using a pressure force (along a lateral axis). In an embodiment, a wire mesh layer is secured to a dielectric layer using a friction force (along a longitudinal axis). In an embodiment, a wire mesh-dielectric sleeve is secured to an electrode using a pressure force (along a lateral axis). In an embodiment, a wire mesh-dielectric sleeve is secured to a dielectric layer using a friction force (along a longitudinal axis).

For example, decreasing the flow rate of an inert gas would generally increase the likelihood of arcing for a given configuration (e.g., process gas flow rate, process gas type, rf power, etc.). However, inserting a set of wire mesh sleeves each with a smaller hole diameter may sustain the plasma at the lower inert gas flow rate without arcing. In addition, different wire mesh materials (e.g., composite metals, platinum, etc.) may also be used, without having to redesign the DWM-APPJ device.

Figure 9:
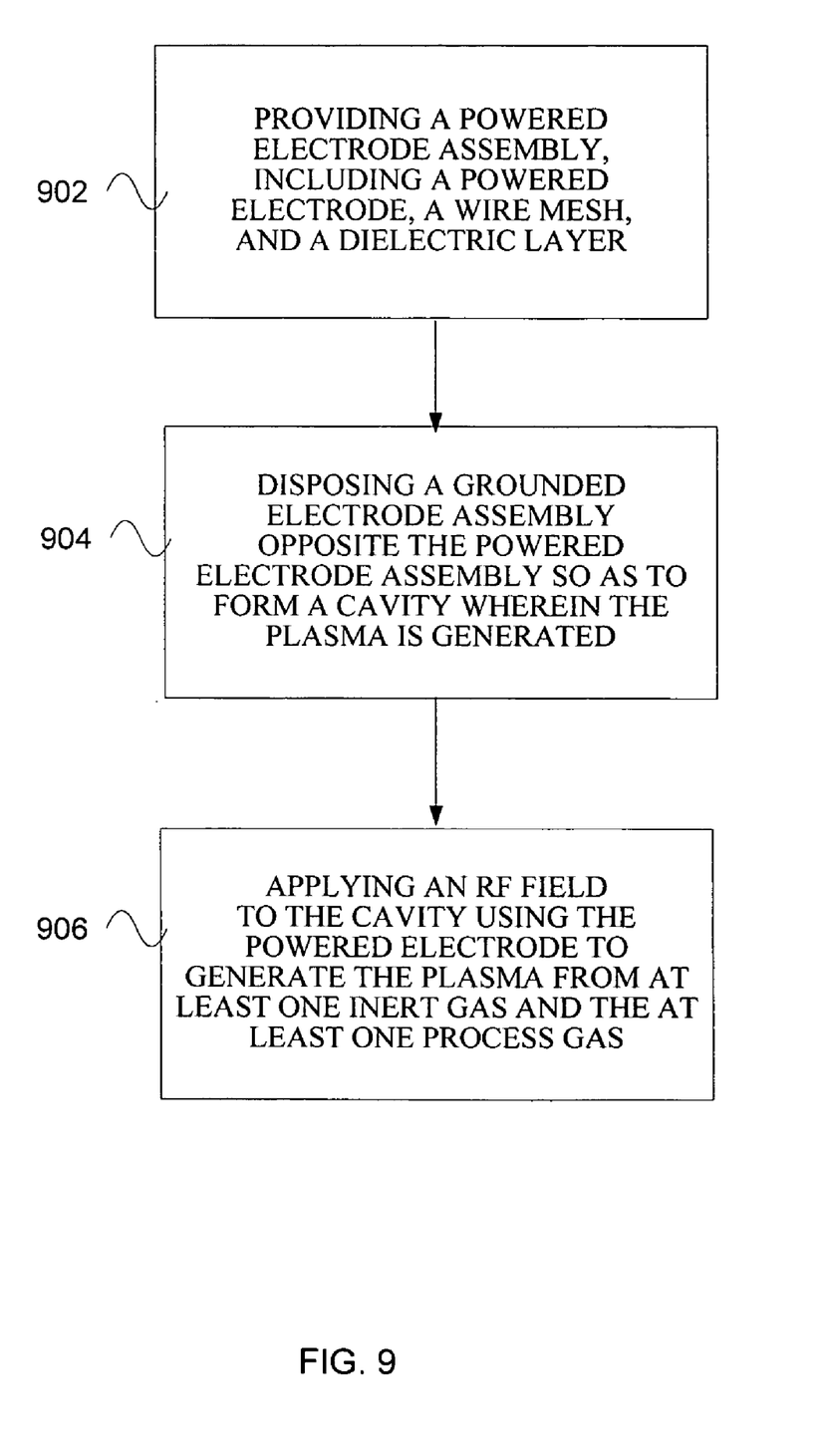
FIG. 9 shows a simplified method of optimally removing a edge polymer from a substrate with a DWM-APPJ device, according to an embodiment of the invention.

Referring now to FIG. 9, a simplified method of optimally removing a edge polymer from a substrate with a DWM-APPJ device is shown, according to an embodiment of the invention. Initially, at 902, a powered electrode assembly, including a powered electrode, a wire mesh, and a dielectric layer is provided. In an embodiment, the wire mesh may include one of copper, stainless steel, brass, and galvanized metal. In an embodiment, the dielectric layer may include one of silicon dioxide, silicon nitride, boPET (such as MYLAR®), ceramic, or PTFE (such as TEFLON®). Next, at 904, a grounded electrode assembly is disposed opposite the powered electrode assembly so as to form a cavity wherein the plasma is generated. In an embodiment, the cavity may be an annular volume. In an embodiment, the powered electrode is a longitudinal probe configured in the cavity. Next, at 906, an rf field is applied to the cavity using the powered electrode to generate the plasma from at least one inert gas and the at least one process gas.

This invention is substantially distinguished from the prior art in several respects. For example, this combines at least one dielectric barrier and at least one wire mesh with an APPJ (DWM-APPJ) in order to generate a plasma jet that substantially removes edge polymer byproducts with a relatively small inert gas flow rate (less than about 1 slm). In addition, unlike common and more complex APPJ device configurations, this invention does not reduce arcing through the use of slots, high flow velocities, and/or an alumina cap. Furthermore, this invention does not require any specialized and/or equipment to maintain a vacuum, does not physically contact to the substrate minimizing the likelihood of a damaging scratch, and is relatively easy to integrate into existing processes because of the minimal equipment requirements.

While this invention has been described in terms of several preferred embodiments, there are alterations, permutations, and equivalents which fall within the scope of this invention. For example, although the present invention has been described in connection with Lam Research plasma processing systems (e.g., Exelan™, Exelan™ HP, Exelan™ HPT, 2300™, Versys™ Star, etc.), other plasma processing systems may be used. This invention may also be used with substrates of various diameters (e.g., 200 mm, 300 mm, LCD, etc.). Furthermore, the term set as used herein includes one or more of the named element of the set. For example, a set of "X" refers to one or more "X."

Advantages of the invention include the removal of an edge polymer from a substrate at a relatively low (less than about 1 slm) inert gas flow rate with minimal arcing. Additional advantages include the ability to easily integrate a DWM-APPJ cleaning device into an in-situ wet cleaning process, and the optimization of a substrate manufacturing process.

Having disclosed exemplary embodiments and the best mode, modifications and variations may be made to the disclosed embodiments while remaining within the subject and spirit of the invention as defined by the following claims.

What is claimed is:

1. An apparatus for removing an edge polymer from a substrate, the apparatus comprising:
    a powered electrode;
    a first dielectric layer;
    a first wire mesh disposed between said powered electrode and said first dielectric layer, said first wire mesh surrounding said powered electrode, said first dielectric layer surrounding said first wire mesh;
    a second dielectric layer disposed between said first dielectric layer and said power electrode, wherein said first wire mesh is sandwiched between said first dielectric layer and said second dielectric layer;
    a grounded electrode disposed above an edge of said substrate, said powered electrode disposed between two portions of said grounded electrode, said grounded electrode including at least an orifice at one end of said grounded electrode for providing plasma to remove said edge polymer; and
    an inert gas jet positioned above a location on a surface said substrate, said location being away from said edge of said substrate, said inert gas jet configured to provide inert gas in a direction to push byproducts produced by said plasma away from said substrate in said direction.

2. The apparatus of claim 1, wherein said grounded electrode is an annular volume.

3. The apparatus of claim 1, wherein said powered electrode is a longitudinal probe configured in said grounded electrode.

4. The apparatus of claim 1 further comprising a power source, wherein a diameter of each hole of said first wire mesh is less than a wavelength of a signal provided by said power source.

5. The apparatus of claim 1 further comprising a power source, wherein each surface variation of said first wire mesh is less than a wavelength of a signal provided by said power source.

6. The apparatus of claim 1, wherein said first wire mesh is configured for operating the apparatus with a first recipe and is configured to be replaced with a second wire mesh for operating the apparatus with a second recipe.

7. The apparatus of claim 1 wherein said inert gas jet positioned is positioned away from said powered electrode and said grounded electrode, and said inert gas is not provided through said grounded electrode.

8. The apparatus of claim 1 further comprising:
a second powered electrode;
a third dielectric layer;
a second wire mesh disposed between said second powered electrode and said third dielectric layer; and
a second grounded electrode disposed opposite to said grounded electrode and disposed under said edge of said substrate, said second powered electrode disposed between two portions of said second grounded electrode, said second powered electrode and said second grounded electrode configured to generate second plasma, said second plasma configured to protrude from said second grounded electrode to reach said substrate, wherein said powered electrode assembly and said second powered electrode assembly are disposed at different sides with respect to said substrate.

9. An apparatus for removing one or more polymer deposits from a substrate, the apparatus comprising:
a first grounded electrode disposed above an edge of said substrate, said first grounded electrode forming a first cavity, a first plasma configured to be generated in said first cavity, said first plasma configured to protrude from said first cavity to reach a first side of said substrate;
a first powered electrode, at least a portion of said first powered electrode is disposed in said first cavity;
a first dielectric barrier disposed in said first cavity and surrounding said portion of said first powered electrode;
a first wire mesh disposed between said first dielectric barrier and said portion of said first powered electrode, said first wire mesh surrounding said portion of said first powered electrode, said first dielectric barrier surrounding said first wire mesh;
a second dielectric barrier disposed between said first dielectric barrier and said portion of said first powered electrode, wherein said first wire mesh is sandwiched between said first dielectric barrier and said second dielectric barrier; and
a first inert gas jet positioned above a location on a surface said substrate, said location being away from said edge, said first inert gas jet configured to provide inert gas in a direction to push byproducts produced by said plasma away from said substrate in said direction.

10. The apparatus of claim 9 wherein said first wire mesh is bonded to said first dielectric barrier.

11. The apparatus of claim 9 wherein said first inert gas jet is positioned away from said first powered electrode and said first grounded electrode, and said inert gas is not provided through said first grounded electrode.

12. The apparatus of claim 9 further comprising:
a second grounded electrode, said second grounded electrode forming a second cavity, a second plasma configured to be generated in said second cavity, said second plasma configured to protrude from said second cavity to reach a second side of said substrate, said second side of said substrate opposite to said first side of said substrate;
a second powered electrode, at least a portion of said second powered electrode is disposed in said second cavity;
a third dielectric barrier disposed in said second cavity and surrounding said portion of said second powered electrode; and
a second wire mesh disposed between said third dielectric barrier and said portion of said second powered electrode.

13. The apparatus of claim 12 further comprising a fourth dielectric barrier disposed between said third dielectric barrier and said portion of said second powered electrode, wherein said second wire mesh is sandwiched between said third dielectric barrier and said fourth dielectric barrier.

* * * * *